(12) United States Patent
Carpenter et al.

(10) Patent No.: US 7,234,412 B2
(45) Date of Patent: Jun. 26, 2007

(54) SEMICONDUCTOR SUBSTRATE DEPOSITION PROCESSOR CHAMBER LINER APPARATUS

(75) Inventors: Craig M. Carpenter, Boise, ID (US); Ross S. Dando, Nampa, ID (US); Philip H. Campbell, Meridian, ID (US); Allen P. Mardian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 241 days.

(21) Appl. No.: 10/350,554

(22) Filed: Jan. 23, 2003

(65) Prior Publication Data

US 2003/0194829 A1 Oct. 16, 2003

Related U.S. Application Data

(62) Division of application No. 10/121,302, filed on Apr. 11, 2002, now Pat. No. 6,613,587.

(51) Int. Cl.
 *C23C 16/00* (2006.01)
(52) U.S. Cl. ................................. 118/723 R
(58) Field of Classification Search ............ 118/723 R, 118/723 I, 723 IR, 723 AN, 723 MW, 723 ME, 118/723 MR, 723 E, 723 ER, 719, 715, 728–733, 118/723 MA; 156/345.3, 345.31, 345.32, 156/345.41–345.55
See application file for complete search history.

(56) References Cited

U.S. PATENT DOCUMENTS

| | | | | |
|---|---|---|---|---|
| 4,573,431 A | * | 3/1986 | Sarkozy | 118/725 |
| 4,883,020 A | * | 11/1989 | Kasai et al. | 118/719 |
| 4,981,102 A | * | 1/1991 | Gautreaux et al. | 118/725 |
| 5,948,704 A | | 9/1999 | Benjamin et al. | 438/715 |
| 6,056,823 A | * | 5/2000 | Sajoto et al. | 118/715 |
| 6,277,237 B1 | | 8/2001 | Schoepp et al. | 156/345 |
| 6,403,491 B1 | | 6/2002 | Liu et al. | 438/710 |
| 6,527,865 B1 | | 3/2003 | Sajoto et al. | 118/715 |
| 6,716,302 B2 | * | 4/2004 | Carducci et al. | 156/345.47 |
| 2002/0069970 A1 | * | 6/2002 | Noorbakhsh et al. | 156/345.37 |
| 2002/0102858 A1 | | 8/2002 | Wicker et al. | 438/731 |
| 2003/0079689 A1 | * | 5/2003 | Sumakeris et al. | 118/725 |

* cited by examiner

*Primary Examiner*—Luz Alejandro-Mulero
(74) *Attorney, Agent, or Firm*—Wells St. John P.S.

(57) ABSTRACT

A method includes removing at least a piece of a deposition chamber liner from a deposition chamber by passing it through a passageway to the deposition chamber through which semiconductor substrates pass into and out of the chamber for deposition processing. A replacement for the removed deposition chamber liner piece is provided into the chamber by passing the replacement through said passageway. A liner apparatus includes a plurality of pieces which when assembled within a selected semiconductor substrate deposition processor chamber are configured to restrict at least a majority portion of all internal wall surfaces which define said semiconductor substrate deposition processor chamber from exposure to deposition material within the chamber. At least some of the pieces are sized for passing completely through a substrate passageway to the chamber through which semiconductor substrates pass into and out of the chamber for deposition processing.

7 Claims, 9 Drawing Sheets

SEMICONDUCTOR SUBSTRATE DEPOSITION PROCESSOR CHAMBER LINER APPARATUS

This patent resulted from a divisional application of U.S. patent application Ser. No. 10/121,302, filed Apr. 11, 2002, entitled "Method of Replacing At Least a Portion of a Semiconductor Substrate Deposition Chamber Liner, Method of Depositing Materials Over a Plurality of Semiconductor Substrates, and Semiconductor Substrate Deposition Processor Chamber Liner Apparatus", naming Craig M. Carpenter, Ross S. Dando, Philip H. Campbell, Allen P. Mardian and Gurtej S. Sandhu as inventors, and which now is U.S. Pat. No. 6,613,587, the disclosure of which is incorporated by reference.

TECHNICAL FIELD

This invention relates to methods of replacing at least a portion of a semiconductor substrate deposition chamber liner, to methods of depositing materials over a plurality of semiconductor substrates, and to liners for semiconductor substrate deposition processing chambers.

BACKGROUND OF THE INVENTION

Semiconductor processing in the fabrication of integrated circuitry typically includes the deposition of layers on semiconductor substrates. Exemplary processes include physical vapor deposition (PVD), and chemical vapor deposition (CVD) including atomic layer deposition (ALD). With typical ALD, successive mono-atomic layers are adsorbed to a substrate and/or reacted with the outer layer on the substrate, typically by successive feeding of different precursors to the substrate surface.

Chemical and physical vapor depositions can be conducted within chambers or reactors which retain a single substrate upon a wafer holder or susceptor. The chambers include internal walls which can undesirably have deposition product deposited thereupon in addition to the substrate. This is particularly problematic in ALD and other CVD processes, yet can also occur in PVD chambers. One existing method of protecting or preserving the internal chamber wall is to shield such from the deposition material with one or more removable liners. These liners might be received immediately adjacent or against the internal chamber walls. Alternately, the liners might be displaced therefrom, thereby defining an appreciably reduced volume chamber within which the substrate is received for deposition. One advantage of using liners is that they can be periodically replaced with new or cleaned liners, thereby extending the life of the deposition chambers. Further and regardless, the spent liners can typically be removed and replaced much more quickly than the time it would take to clean the internal chamber walls at a given cleaning interval.

The present method for replacing the liners includes partial disassembly of the deposition chamber. Specifically, the lid is typically removed to provide access to the liners for their quick removal and replacement with fresh liners. The deposition processor is then reassembled for use. The spent liners can thereby be discarded or cleaned for re-use without adding to the downtime for the processor for the same. Such methods do however expose the entire deposition processor apparatus to clean room ambient conditions, thereby increasing downtime, thermal cycling and pressure cycling of the apparatus. It would be desirable to develop methods and structures that can be used to minimize or eliminate such downtime and temperature and pressure cycling.

The invention was motivated in overcoming the above-described drawbacks, although it is in no way so limited. The invention is only limited by the accompanying claims as literally worded without interpretative or other limiting reference to the specification or drawings, and in accordance with the doctrine of equivalents.

SUMMARY

The invention includes methods of replacing at least a portion of a semiconductor substrate deposition chamber liner, methods of depositing materials over a plurality of semiconductor substrates, and semiconductor substrate deposition processor chamber liner apparatus. In one implementation, a method of replacing at least a portion of a semiconductor substrate deposition chamber liner includes removing at least a piece of a deposition chamber liner from a deposition chamber by passing it through a passageway to the deposition chamber through which semiconductor substrates pass into and out of the chamber for deposition processing. A replacement for the removed deposition chamber liner piece is provided into the chamber by passing the replacement through said passageway through which semiconductor substrates pass into and out of the chamber for deposition processing.

In one implementation, a semiconductor substrate deposition processor chamber liner apparatus includes a plurality of pieces which when assembled within a selected semiconductor substrate deposition processor chamber are configured to restrict at least a majority portion of all internal wall surfaces which define said semiconductor substrate deposition processor chamber from exposure to deposition material within the chamber. At least some of the pieces are sized for passing completely through a substrate passageway to the chamber through which semiconductor substrates pass into and out of the chamber for deposition processing.

BRIEF DESCRIPTION OF THE DRAWINGS

Preferred embodiments of the invention are described below with reference to the following accompanying drawings.

FIG. 9 is a diagrammatic sectional view like FIG. 6 but shown in a further operational configuration.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
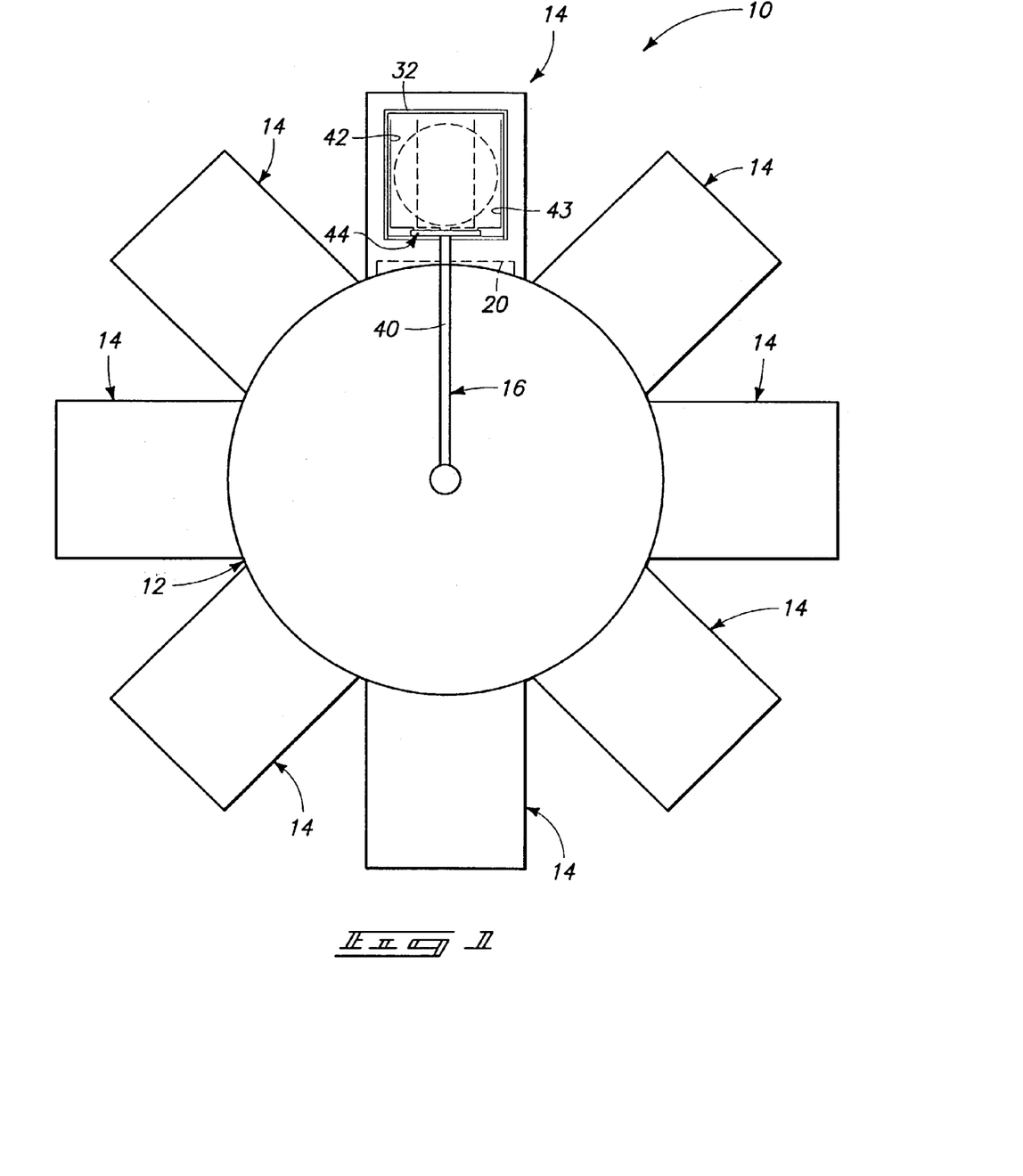
FIG. 1 is a diagrammatic top plan view of a cluster processing apparatus.

Referring initially to FIG. 1, an exemplary cluster processing apparatus is indicated generally with reference 10. Such includes a subatmospheric transfer chamber 12 having a plurality of substrate processors or load lock chambers 14 peripherally received thereabout. Load lock chambers are utilized to transfer semiconductor substrates, typically individually, from room ambient to within processor 10 for deposition or other processing within the processing chambers 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A mechanism 16 is associated with subatmospheric transfer chamber 12 for transferring the substrates into and out of the respective processors 14. FIG. 1 shows mechanism 16 engaging relative to one of processors 14, with FIGS. 2–9 showing sectional diagrammatic depictions of different operational configurations associated with the one deposition processor. Of course, the depicted cluster apparatus 10 and processor chambers 14 are only exemplary, and merely provide an exemplary environment within which a method in accordance with the invention can be practiced and within which a deposition processor chamber liner apparatus can be used. The concluding claims are in no way limited by the environment but for the literal wording appearing in such claims, and without limiting or interpretative reference to the specification or drawings, and in accordance with the doctrine of equivalents.

Figure 2:
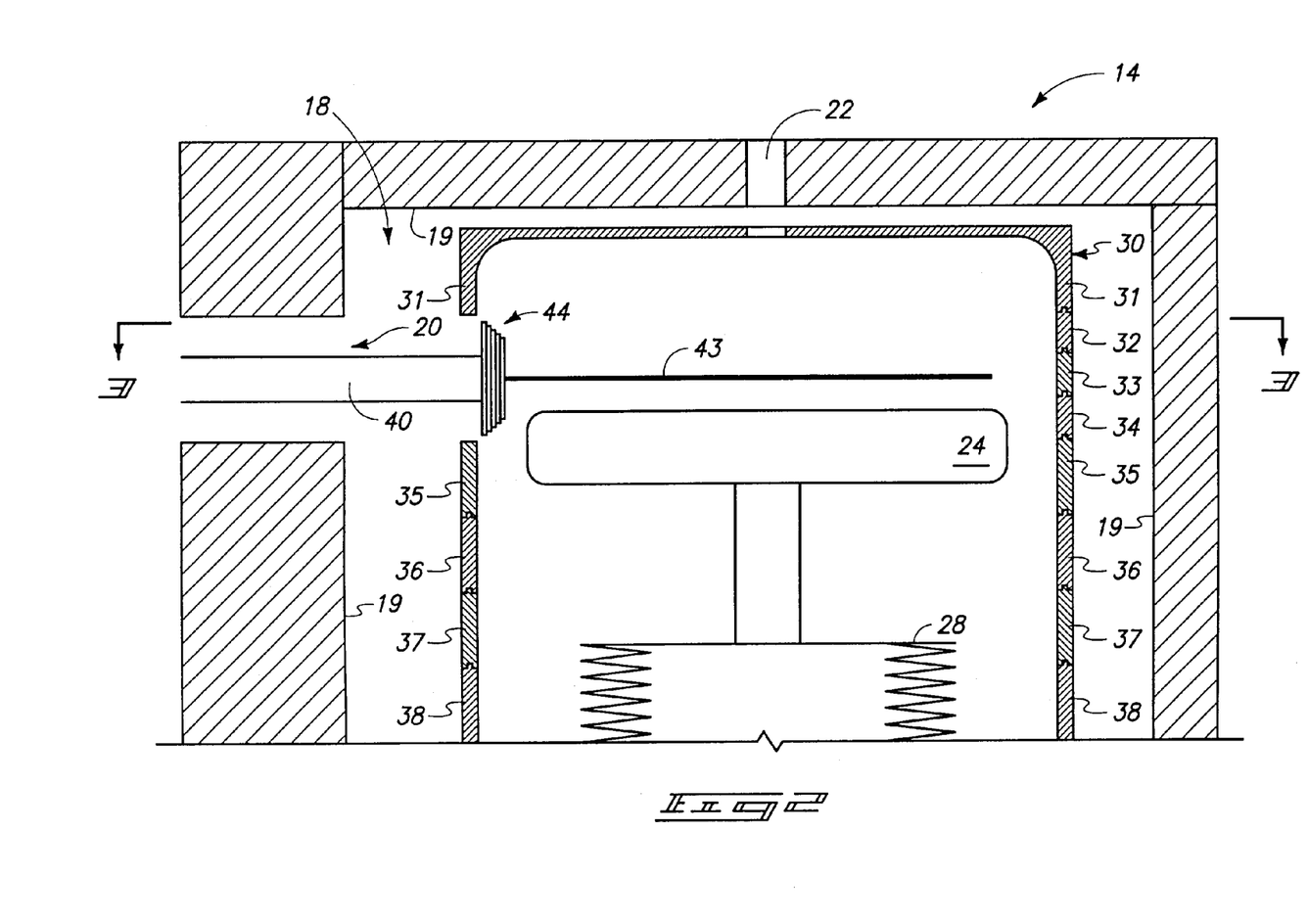
FIG. 2 is a diagrammatic sectional view of a portion of the apparatus of FIG. 1 shown in one operational configuration.
Figure 3:
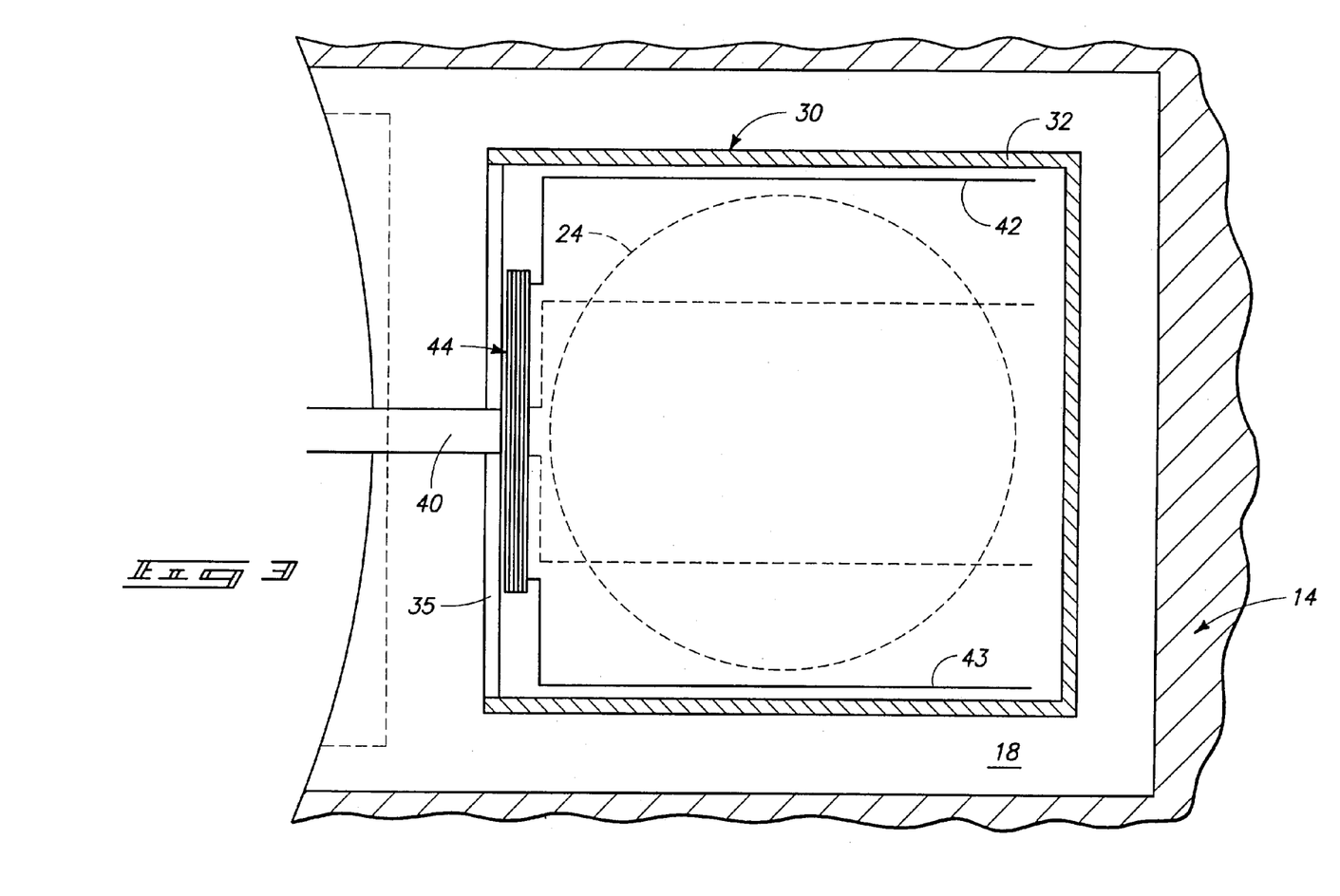
FIG. 3 is a diagrammatic sectional view taken through line 3—3 in FIG. 2.

Referring to FIGS. 1–3, deposition processor 14 includes a semiconductor substrate deposition chamber 18 which will be at subatmospheric pressure during deposition processing. Such includes internal wall surfaces 19. In the depicted example, processor 14 is shown in the form of an ALD or other CVD processor chamber having an exemplary gas inlet 22 diagrammatically shown at the top for the injecting of one or more precursor gasses to within chamber 18. Showerheads or other gas dispersing devices might also be used.

Subatmospheric deposition chamber 18 is provided in communication with subatmospheric transfer chamber 12 by or through a passageway 20. Such is an exemplary passageway through which semiconductor substrates pass into and out of chamber 18 relative to transfer chamber 12 for deposition processing. One exemplary existing passageway has a maximum height of 0.75 inch and a maximum width of 8.25 inches. The invention contemplates use with deposition chambers having passageways of these respective size dimensions or lesser of one or both dimensions, as well as passageways having greater size in one or both dimensions.

Processor 14 includes a movable substrate holder or heater 24. Such is diagrammatically shown as being supported by a post 26. A mechanism 28 is associated with post 26 for raising and lowering substrate heater/support 24. In typical existing processing, an individual wafer would be positioned from subatmospheric transfer chamber 12 through passageway 20 and onto wafer heater/support 24 utilizing an extendable arm of mechanism 16. Heater/support 24 typically includes a series of upwardly projecting and retractable pins upon which the wafer would be initially placed. The placement arm or paddle of mechanism 16 would then be retracted from the deposition chamber through passageway 20. The pins would be lowered/retracted such that the substrate rests atop the depicted upper surface of heater/support 24. Heater/support 24 would then be raised with mechanism 28 to position the wafer more proximate the showerhead (not shown) at the upper surface of the chamber with which inlet 22 communicates. At the conclusion of deposition processing, the process is reversed with the substrate being removed from chamber 18 through passageway 20.

The invention of course also contemplates any other deposition chamber, whether existing or yet-to-be developed, including, by way of example only, physical vapor deposition chambers.

In accordance with structural aspects of the invention, one exemplary liner apparatus 30 is shown received within deposition processor chamber 18. Such is configured to at least partially restrict at least a majority portion of all internal wall surfaces 19, which define semiconductor substrate deposition processor chamber 18, from exposure to deposition material within chamber 18. Liner apparatus 30 is depicted as comprising a plurality of pieces 31, 32, 33, 34, 35, 36, 37 and 38. At least some of such pieces are sized for passing completely through substrate passageway 20 to chamber 18 through which semiconductor substrates pass into and out of the chamber for deposition processing. In one embodiment, only some of the pieces are sized for passing completely through such passageway, whereas in another embodiment, all of such pieces are sized for passing completely through the passageway. FIG. 2 depicts an embodiment wherein all such pieces are intended to depict sizing for insertion and removal capability through passageway 20. FIG. 2 depicts pieces 31, 35, 36, 37 and 38 as being annular, whereas pieces 32, 33 and 34 are depicted as not being annular. In the context of this document, "annular" includes any ring-like structure, whether perfectly circular and/or with rounded or angled corners. Further, some of the sized pieces might not be annular, but be shaped for interconnection into an annular-shaped portion of the apparatus. For example and by way of example only, one or more of the respective pieces 35, 36, 37 and 38 might constitute two or more partial ring-like segments which, when connected, form an annular-shaped portion of the apparatus.

By way of example only, the respective pieces of liner apparatus 30 are depicted as having respective tongue and groove interconnections with one another. Of course, any other interlocking, non-interlocking and/or overlapping configurations are contemplated.

Gas delivery hardware may or may not be statically or dynamically connected, or otherwise associated, with the process chamber liner to facilitate gas insertion into the subchamber formed by the liner over the wafer and wafer heater/carrier/susceptor. Further, the liner profile or shape may be formed in any configuration, for example to optimize gas flow characteristics to the substrate. Further by way of example only, inert purge gas feeds may or may not be configured to purge the subchamber volume above and/or exterior to the subchamber formed by the liner in the process chamber. The liner apparatus can be made from any existing or yet-to-be developed material(s), and can be chosen based upon process considerations.

The invention contemplates a method of replacing at least a portion of a semiconductor substrate deposition chamber liner essentially independent of the preferred embodiment apparatus just described. One exemplary implementation includes removing at least a piece of a deposition chamber liner from a deposition chamber by passing it through a passageway to the deposition chamber through which semiconductor substrates pass into and out of the chamber for deposition processing. A replacement for the removed deposition chamber liner piece is provided into the chamber by passing the replacement through such passageway. Most preferably, the deposition chamber is maintained at subatmospheric pressure during the removing and the providing of the replacement, and any time therebetween. Even further most preferably, the deposition chamber is maintained at a substantially constant subatmospheric pressure during the removing of the piece and the providing of the replacement, and any time therebetween. In one methodical embodiment, the deposition chamber liner is comprised of multiple pieces, with all such pieces being removed from the deposition chamber and replaced with substitutes, all of which pass through the passageway to the deposition chamber through which semiconductor substrates pass into and out of the chamber for deposition processing, for example and by way of example only, the above-described and depicted liner apparatus 30.

Figure 4:
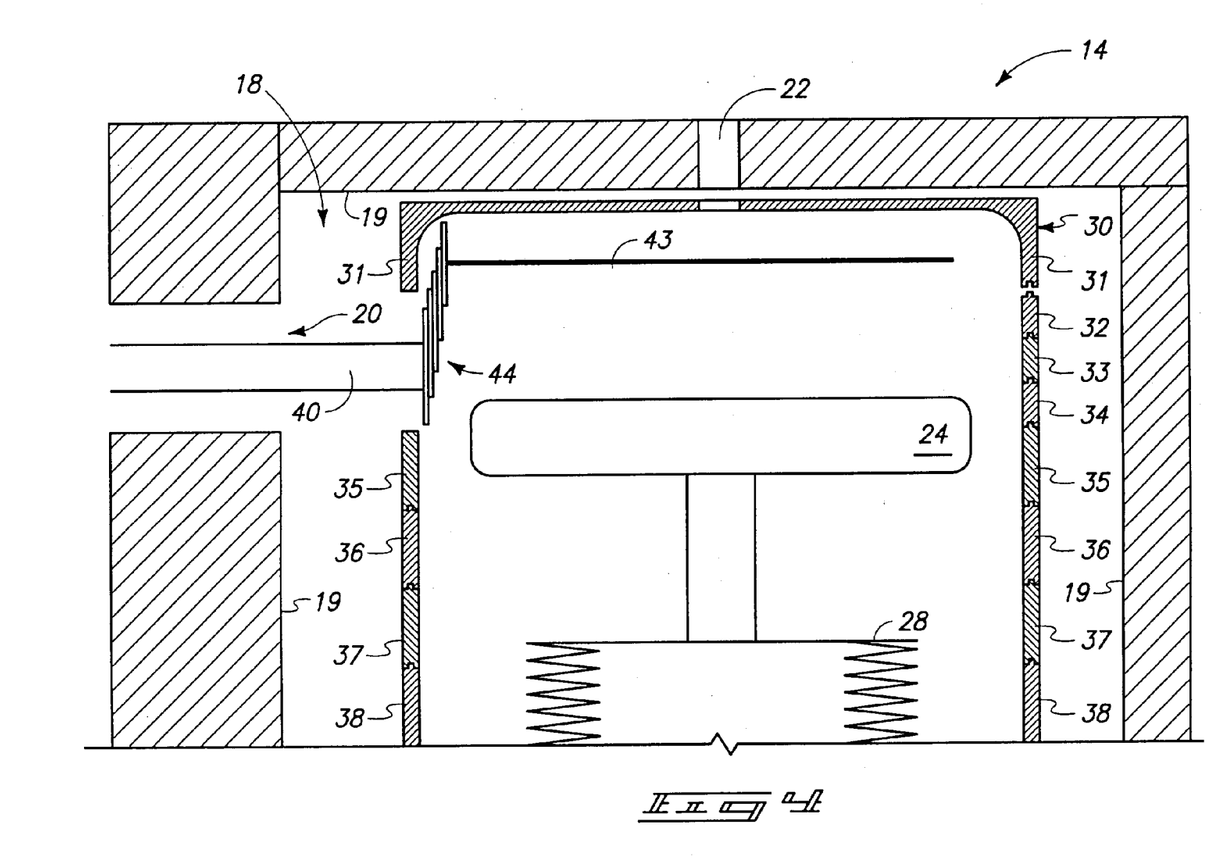
FIG. 4 is a diagrammatic sectional view like FIG. 2 but shown in another operational orientation.
Figure 5:
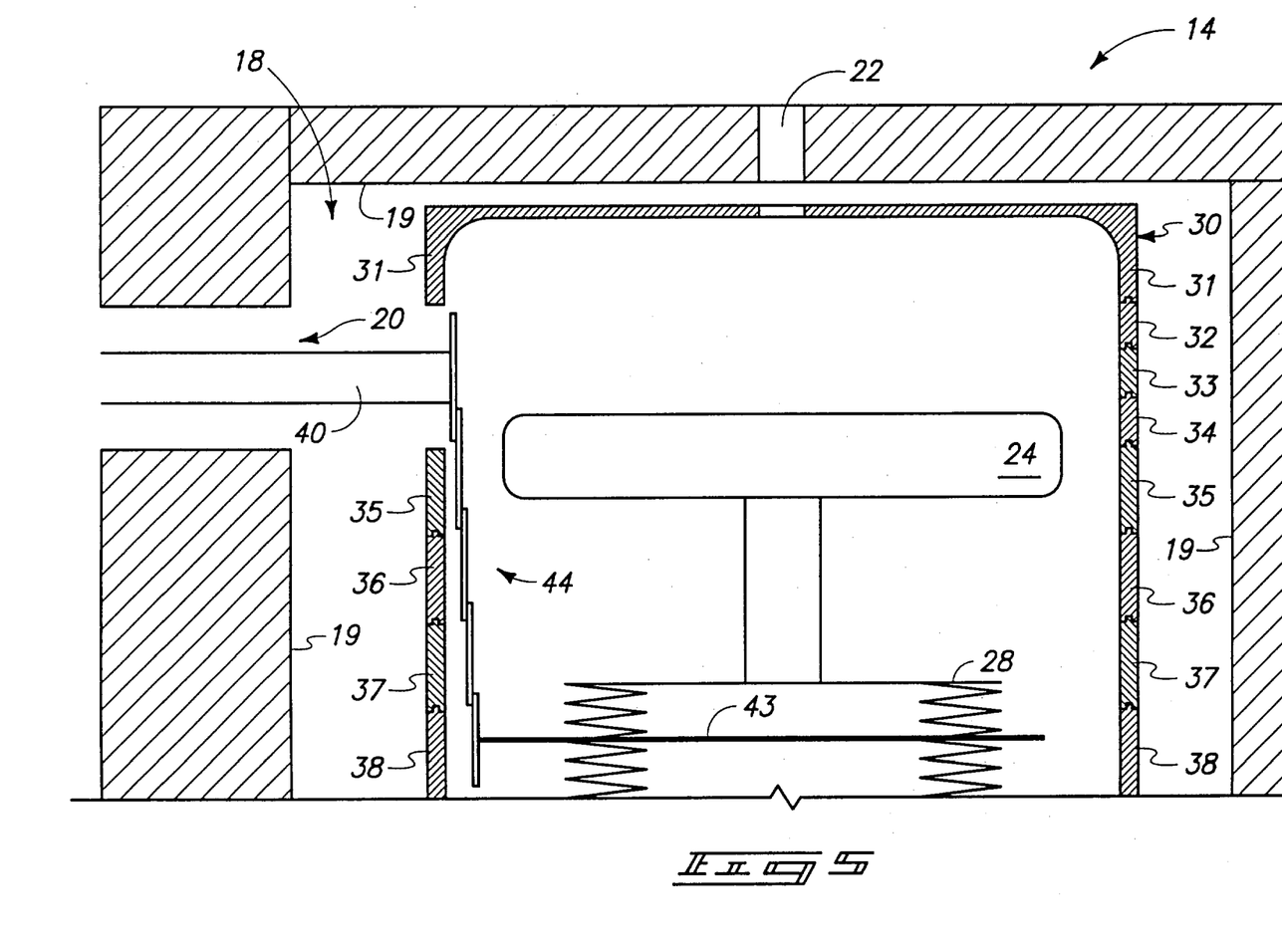
FIG. 5 is a diagrammatic sectional view like FIG. 2 but shown in still another operational orientation.

By way of example only, one exemplary method of carrying out methodical aspects of the invention as just so stated is described with reference to FIGS. 2–4. Such depicts exemplary hardware associated with cluster apparatus 10 which can be utilized for practicing methodical aspects of the invention. However, methodical aspects of the invention are in no way limited to utilization of the depicted hardware. Practice of the invention utilizing any hardware, whether existing or yet-to-be developed, is contemplated in accordance with the methodical aspects of the invention, which are to be limited only by the accompanying claims as literally worded, without limiting or interpretative reference to the specification, and in accordance with the doctrine of equivalents.

FIGS. 1–3 depict transfer mechanism 16 as having an arm 40 which is extendable to within deposition chamber 18. The operative end of arm 40 is diagrammatically depicted as having a pair of opposing prongs/paddles 42, 43. Such are depicted for lateral inward and outward movement for engaging at least one piece of a deposition chamber liner within deposition chamber 18. Prongs/paddles 42, 43 are also depicted as being mounted at the end of arm 40 for elevational raising (FIG. 4) and lowering (FIG. 5) within deposition chamber 18. Such is only diagrammatically illustrated in the form of an overlapping/telescoping mechanism assembly 44 as one possible implementation for effecting the desired movements for engaging any of the depicted pieces 31–38 of the exemplary liner apparatus 30. Again, any mechanism for inserting at least one piece of a chamber liner into the chamber is contemplated, for example whether received within the chamber, a transfer chamber or external thereof, and whether man-powered or powered by other means, for example by electrical, pneumatic, magnetic and any other means of inciting motion whether existing or yet-to-be developed. Further by way of example only, the mechanism for providing and inserting the chamber liner into the chamber in an operative position may have many axes of movement, non-limiting examples of which include extension, rotation on extension, blade rotation about numerous axes, elevation of blade, elevation of extension, and others.

One exemplary methodical implementation would engage a piece of a deposition chamber liner with an arm extending through a passageway to the deposition chamber through which semiconductor substrates pass into and out of the chamber for deposition processing. One exemplary method of engaging would be to utilize arm 40 and its associated hardware as depicted in FIGS. 1–5. For example and by way of example only, the depicted apparatus could be configured as shown in FIG. 4, with arms 42, 43 moved radially outwardly internally of piece 31 for bearing engagement thereof. Alternately by way of example only, arms 42, 43 could be used to grasp piece 31 by squeezing against opposing outer lateral surfaces thereof. Liner piece 31 could then be lifted upwardly from the liner apparatus assembly 30, as shown in FIG. 4. FIG. 2 depicts liner apparatus 30, and all liner subpieces thereof, received in an operable lining position within chamber 18 when semiconductor substrates are deposited upon within the chamber. The exemplary described FIG. 4 engaging and lifting effectively displaces chamber liner piece 31 from such lining position by arm mechanism 40.

By way of example only, engaged chamber liner piece 31 could then be moved laterally in the direction of passageway 20 and elevationally lowered to be proximate thereto. Such provides but one exemplary aspect of moving the engaged chamber liner piece with the arm to proximate such passageway. Rotational, pivoting or other movement might be associated therewith to accommodate movement of piece 31 to proximate passageway 20 for ultimate removal from chamber 18 therethrough. Alternately or in addition thereto, piece 31 might constitute a plurality of subpieces which are separately individually grasped and positioned by an arm assembly for ultimate removal from chamber 18 through passageway 20. Regardless, in this example embodiment, the engaged chamber liner piece is removed from deposition chamber 18 with arm 40 by passing the chamber liner piece through passageway 20. In one embodiment, and as depicted, the passing of the piece through the passageway would be in a first direction (i.e., horizontally), wherein the moving of the engaged chamber liner piece with the arm to be proximate the passageway would include moving in a second direction (i.e., vertically) which is generally transverse the first direction.

The above processing could be continued as desired to remove each of the depicted respective pieces 31–38 from the chamber through passageway 20, and most preferably without exposing chamber 18 to room atmospheric pressure conditions. Regardless, a replacement piece or pieces could be provided within the chamber by passing the replacement(s) through passageway 20 with the arm. Further, the replacements could be moved into their respective lining positions within chamber 18 for re-establishing a protective lining within the chamber.

The above-described exemplary methodical and apparatus embodiments basically depict liner apparatus 30 as essentially comprising a free-standing structure. Any alternate construction is contemplated, however, whether existing or yet-to-be developed. For example and by way of example only, one or more pieces of a liner apparatus utilized or constructed in accordance with the invention might be retained or mounted within the chamber by connection with any of the internal chamber walls or subcomponents of the chamber. By way of example only, such might include vacuum retention, mechanical fasteners, magnetic retention, pins, mechanical up/down release mechanisms, bayonet-type rotary mounts, sliding bracket mounts, electromagnetic mounts, etc.

Figure 6:
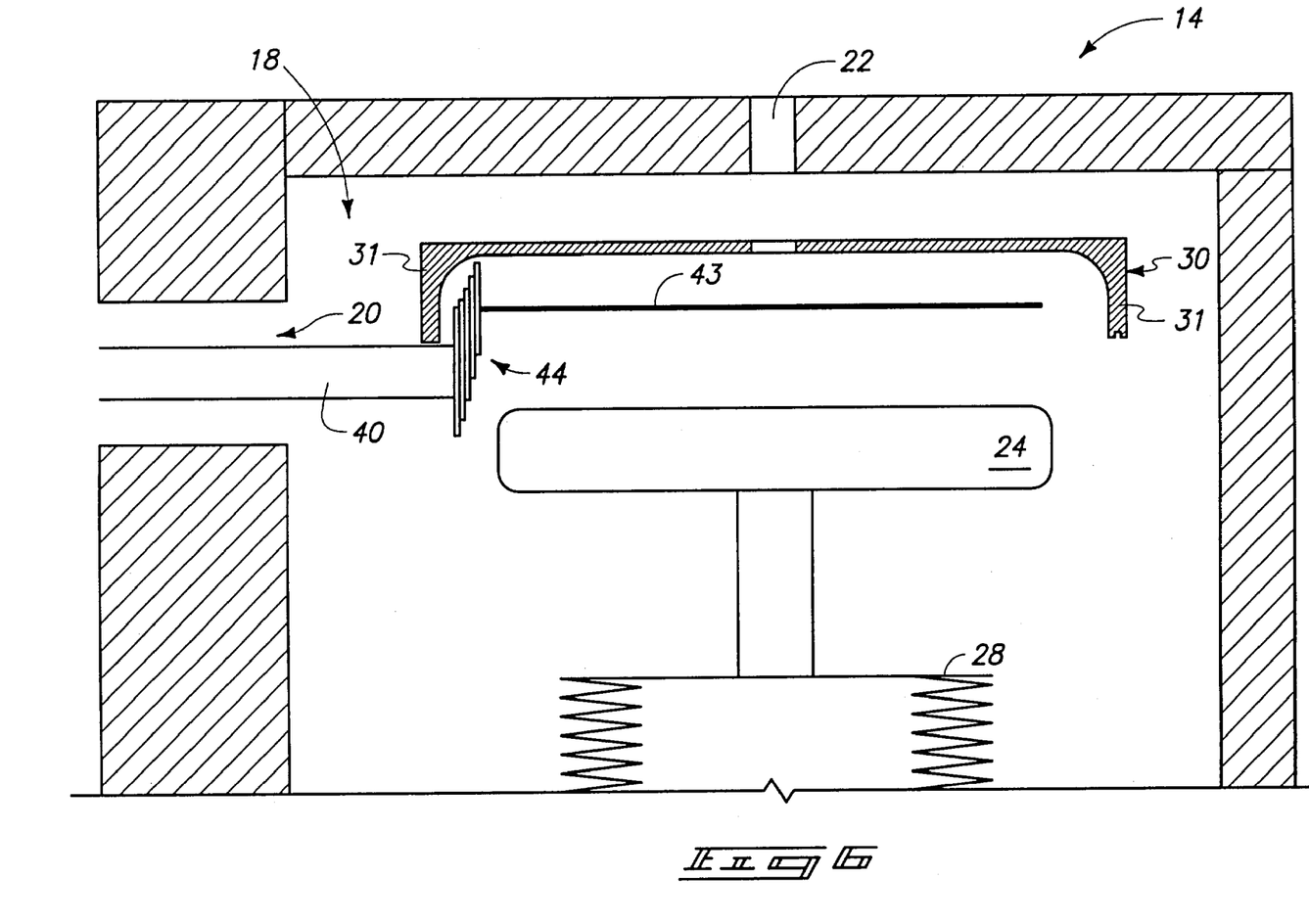
FIG. 6 is a diagrammatic sectional view of a portion of the apparatus of FIG. 1 shown in one operational configuration.
Figure 7:
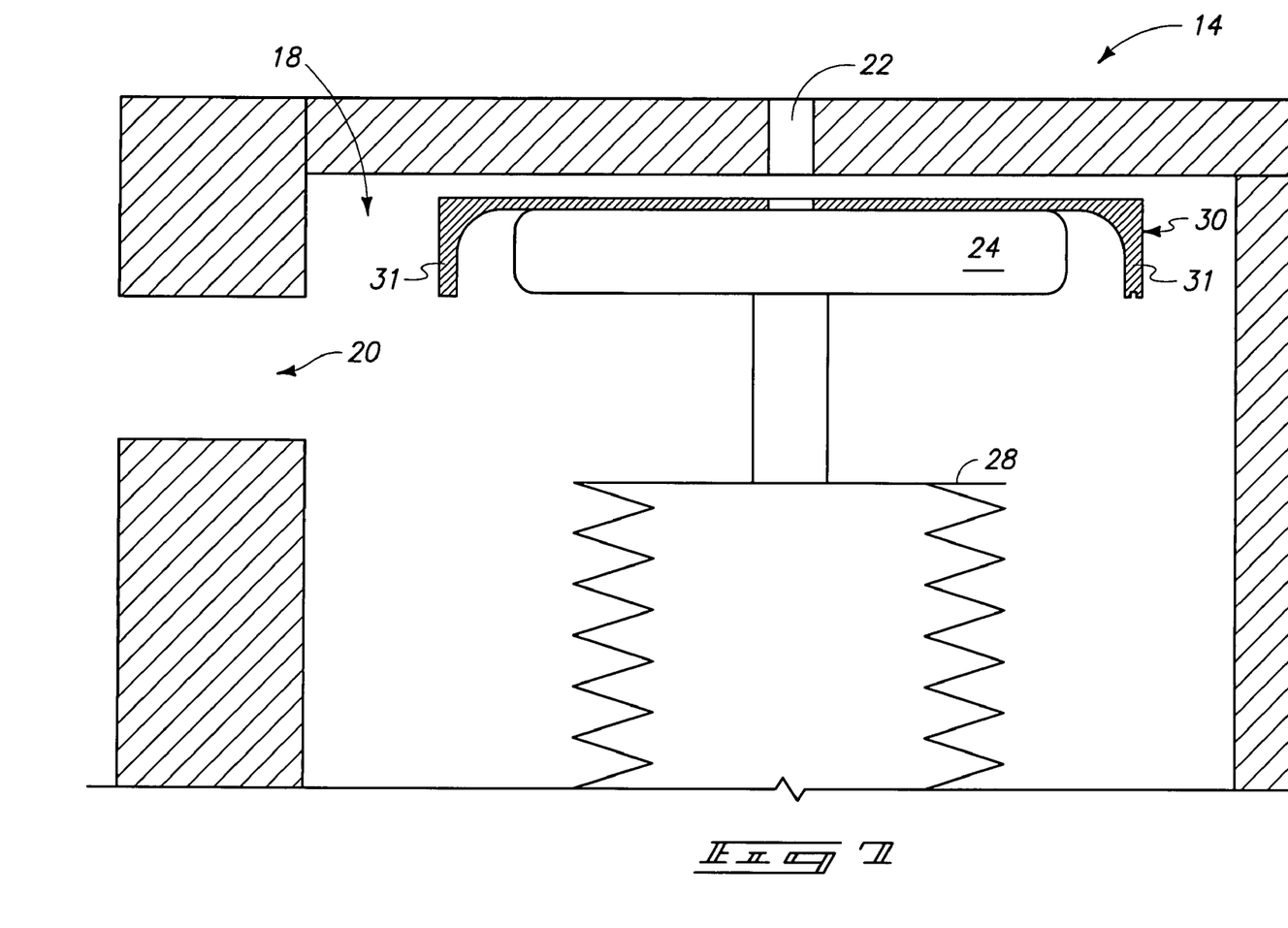
FIG. 7 is a diagrammatic sectional view like FIG. 6 but shown in another operational configuration.

FIGS. 6–9 depict one exemplary embodiment whereby a piece of a deposition chamber liner is engaged with a substrate holder received within the deposition chamber. For example, FIG. 6 depicts chamber liner piece 31 held and engaged by actuator arms 42, 43 within chamber 18. Referring to FIG. 7, heater/support 24 has been moved upwardly to engagingly support chamber liner piece 31, and arm/actuator 40 has been removed from chamber 18.

Figure 8B:
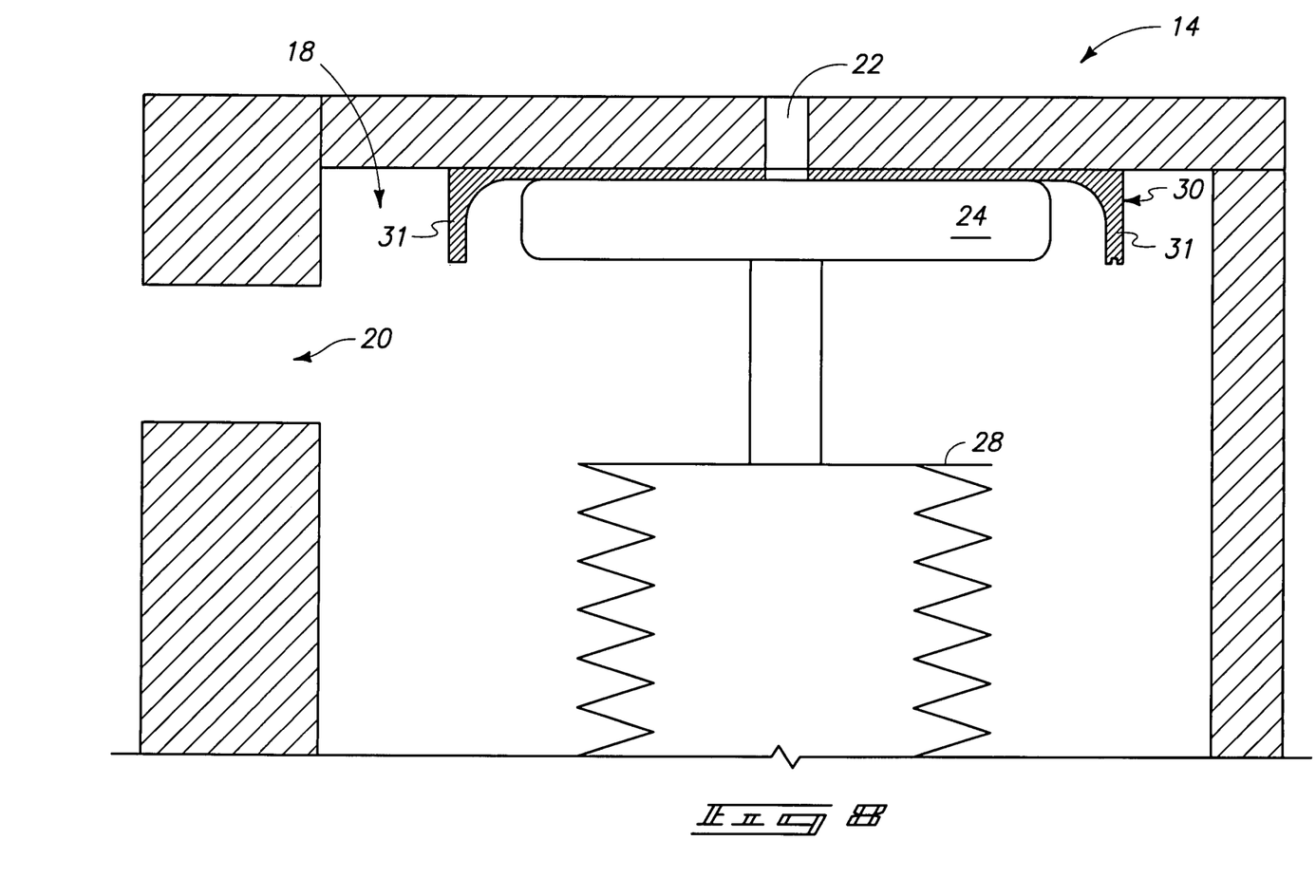
FIG. 8 is a diagrammatic sectional view like FIG. 6 but shown in still another operational configuration.

Referring to FIG. 8, heater/support 24 has been further raised upwardly to bear chamber liner 31 against the upper surface of chamber 18, and to be retained thereagainst ultimately by something other than support 24. Again, any manner, whether existing or yet-to-be developed, for retaining chamber liner piece 31 against or otherwise in position within chamber 18 in FIG. 8 is contemplated.

Referring to FIG. 9, heater/support 24 has been lowered.

A method of replacing piece 31 would include engaging it with semiconductor substrate holder 24 within deposition chamber 18, for example as shown in FIG. 8. Through release of uplocks or other mechanisms or means, either by movement or engagement with heater 24 or otherwise, piece 31 is released or otherwise initially moved/displaced from its FIGS. 8 and 9 depicted operational lining position. The engaged chamber liner piece is then moved with semiconductor substrate holder 24 to proximate passageway 20. Chamber liner piece 31 can then be removed from deposition chamber 18 by passing it through passageway 20, for example utilizing the arm effectors as shown in FIG. 6. Again, replacement therefore can be provided as initially described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor substrate deposition processor chamber liner apparatus comprising: a plurality of pieces which when assembled within a selected semiconductor substrate deposition processor chamber are configured to at least partially restrict at least a majority portion of all internal wall surfaces which define said semiconductor substrate deposition processor chamber from exposure to deposition material within the chamber, all of the pieces of the liner apparatus when assembled being received entirely within the semiconductor substrate deposition processor chamber, at least some of the pieces being sized for passing completely through a substrate passageway to the chamber through which semiconductor substrates pass into and out of the chamber for deposition processing, the liner apparatus when assembled within the semiconductor substrate deposition processor chamber comprising an assembled liner apparatus which is of an assembled size which does not enable passing of the assembled liner apparatus through said substrate passageway; and the assembled liner apparatus forming an internal subchamber and a liner apparatus substrate passageway through which semiconductor substrates pass into and out of the internal subchamber for deposition processing, said at least some of the pieces comprising a first set of pieces which interlock in a stack to form sidewalls of the liner apparatus substrate passageway, and said at least some of the pieces comprising a second set of pieces which interlock in a stack below the stack of the first set of pieces.

2. The apparatus of claim 1 wherein the liner apparatus when assembled within the semiconductor substrate deposition processor chamber is configured to be spaced from innermost lateral sidewalls of the processor chamber.

3. The apparatus of claim 1 wherein the interlock of the plurality of annular pieces and the interlock of the plurality of non-annular pieces respectively comprises male tongue and two laterally sided female groove interconnections.

4. The apparatus of claim 1 wherein the liner apparatus substrate passageway has a cross section which is of the same shape as that of the substrate passageway to the chamber, the liner apparatus substrate passageway being of smaller cross sectional size than that of the substrate passageway to the chamber.

5. The apparatus of claim 4 wherein passageway distance through which substrates pass is greater in the passageway to the chamber than in the passageway to the internal subchamber.

6. The apparatus of claim 1 wherein one of the plurality of pieces comprises a topmost piece having a top segment configured to span across at least a majority of a top wall of said deposition processor chamber and walls extending vertically downward therefrom, the top segment comprising a gas opening extending therethrough which is laterally centered between the vertically extending walls.

7. The apparatus of claim 1 wherein the liner apparatus substrate passageway is of smaller cross sectional size than that of the substrate passageway to the chamber.

* * * * *

UNITED STATES PATENT AND TRADEMARK OFFICE
CERTIFICATE OF CORRECTION

| | | |
|---|---|---|
| PATENT NO. | : 7,234,412 B2 | Page 1 of 1 |
| APPLICATION NO. | : 10/350554 | |
| DATED | : June 26, 2007 | |
| INVENTOR(S) | : Carpenter et al. | |

It is certified that error appears in the above-identified patent and that said Letters Patent is hereby corrected as shown below:

In columns 7–8, lines 43–51 (column 7) and 1–9 (column 8), in claim 1, delete "a plurality of pieces which when assembled within a selected semiconductor substrate deposition processor chamber are configured to at least partially restrict at least a majority portion of all internal wall surfaces which define said semiconductor substrate deposition processor chamber from exposure to deposition material within the chamber, all of the pieces of the liner apparatus when assembled being received entirely within the semiconductor substrate deposition processor chamber, at least some of the pieces being sized for passing completely through a substrate passageway to the chamber through which semiconductor substrates pass into and out of the chamber for deposition processing, the liner apparatus when assembled within the semiconductor substrate deposition processor chamber comprising an assembled liner apparatus which is of an assembled size which does not enable passing of the assembled liner apparatus through said substrate passageway; and" and insert the same on Col. 7, Line 44 below "comprising:" as a new paragraph.

Signed and Sealed this

Twentieth Day of November, 2007

JON W. DUDAS
*Director of the United States Patent and Trademark Office*